United States Patent [19]
Jasmer et al.

[11] Patent Number: 5,111,200
[45] Date of Patent: May 5, 1992

[54] BROADBAND SPACE-DIVISION SWITCHING NETWORK WITH LINKAGE IN A PRINTED CIRCUIT BOARD HAVING MULTI-LAYER MICRO-STRIP LINES

[75] Inventors: Wolfgang E. Jasmer, Hamburg; Johann E. W. Krüger, Quickborn; Ulrich R. P. Killat, Hamburg, all of Fed. Rep. of Germany

[73] Assignee: U.S. Philips Corporation, New York, N.Y.

[21] Appl. No.: 453,033

[22] Filed: Dec. 11, 1989

Related U.S. Application Data

[63] Continuation of Ser. No. 126,395, Nov. 30, 1987, abandoned.

[30] Foreign Application Priority Data

Dec. 2, 1986 [DE] Fed. Rep. of Germany ....... 3641149

[51] Int. Cl.$^5$ .......................... H04B 3/38; H01R 9/00
[52] U.S. Cl. .................................. 340/826; 340/827; 361/406
[58] Field of Search ...... 340/826, 827, 825.79–825.81; 361/406, 413, 416, 412, 417, 404

[56] References Cited

U.S. PATENT DOCUMENTS

| | | | |
|---|---|---|---|
| 2,963,626 | 12/1960 | Du Val, Jr. et al. | 361/416 |
| 3,715,443 | 2/1973 | Ishimura | 84/675 |
| 3,832,603 | 8/1974 | Cray et al. | 361/406 X |
| 4,417,245 | 11/1983 | Melas et al. | 340/625.8 X |
| 4,807,280 | 2/1989 | Posner et al. | 379/327 |

Primary Examiner—Steven L. Stephan
Assistant Examiner—Ben Davidson
Attorney, Agent, or Firm—David R. Treacy

[57] ABSTRACT

In broadband space-division switching networks a multi-layer p.c. board is used for wiring the switching matrices of adjacent switching stages. In case of a plurality of links between the switching matrices a corresponding number of layers of the p.c. board can be provided. The connection of the individual layers of the p.c. board requires much expenditure in point of manufacturing engineering.

This expenditure can be reduced in a surprisingly simple manner, when a canonical linkage in a p.c. board is introduced such, that link sections of the switching matrix are fanned out into groups onto a layer of the p.c. board and combined again. By dividing the links into sections, requirements as regards equal line length, reduction of space required and replacement in case of defects can be met in a simple manner.

13 Claims, 4 Drawing Sheets

BROADBAND SPACE-DIVISION SWITCHING NETWORK WITH LINKAGE IN A PRINTED CIRCUIT BOARD HAVING MULTI-LAYER MICRO-STRIP LINES

This is a continuation of application Ser. No. 126,395, filed Nov. 30, 1987 now abandoned.

BACKGROUND OF THE INVENTION

The invention relates to a broadband space-division switching network with linkage in a printed circuit board.

The wiring of a multi-stage space-division switching network is realized by utilizing canonical linkage. By canonical linkage is understood a special form of the simple and complete linkage in two-stage switching groups, in which the $n^{th}$ output of each switching matrix in the first switching stage is connected to the $n^{th}$ switching matrix of the second switching stage.

A wiring diagram of the switching matrices is shown in FIG. 1. The consecutive n outputs of the switching matrix $M_1(I)$ of the first switching stage KS1 are respectively connected to the first inputs of consecutive switching matrices $M_1(II)$ to $M_n(II)$ of the second switching stage KS2. The n outputs of the switching matrix $M_2(I)$ of the first switching stage KS1 are likewise connected to the second inputs of the respective switching matrices $M_1(II)$ to $M_n(II)$ of the second switching stage. This pattern is continued until, finally, the n outputs of the switching matrix $M_n(I)$ of the first switching stage KS1 are connected to the $n^{th}$ inputs of the switching matrices $M_1(II)$ to $M_n(II)$ of the second switching stage KS2. In a multi-stage switching network the same wiring between the consecutive switching stages is implemented.

A switching network with 256 inputs and outputs, when utilizing switching matrices of 16 inputs and outputs and canonical linkage, requires 256 links between the individual switching stages. Signal transmission at high bit rates (for example 140 Mbits/s) necessitates the implementation of expensive coaxial cable. As a result of the bit accuracy aimed at for the different signal paths, the line lengths of the linkage have to have close tolerances. This conventional wiring by means of coaxial cable requires high manufacturing costs and much space for the switching matrix and the switching network.

Therefore, to reduce the required space, the wiring of the switching matrices of adjacent switching stages is increasingly realized by employing multi-layer platings. From NTZ Vol. 39 (1986) Book 5, pages 312 to 316, more specifically, page 315, a switching network module for 140 Mbit/s in CMOS technology is shown, on which the wiring of the switching matrices of adjacent switching stages having 64 in/outputs is effected by employing a six-layer printed circuit board.

Furthermore, in a paper for a lecture held at the NTG Professional Meeting from 25 to 27 Mar. 1985 ("Konzeption und Realisierung eines Breitband-Koppelnetzes für 70 Mbit/s" by K. T. Langer et al, published in "Wege zum integrierten Kommunikationsnetz", lectures of the NTG Professional Meeting from 25 to 27 Mar. 1985 in Berlin, VDE-Verlag GmbH) a broadband switching network has been proposed, in which the wiring of the switching matrices of adjacent switching stages is realized by means of a 17-layer printed circuit board. The individual switching stages in the embodiment proposed therein, comprise on each printed circuit board 16 switching matrices having 16 inputs and outputs each, so that between the individual boards 256 links are required.

In view of obtaining a low power dissipation for the broadband switching network the shortest possible links are required, so that the printed circuit boards of the third stage of the five-stage switching network are turned through 90° relative to the other stages. The decoupling of the links is effected by means of the multi-layer stripline wiring (a line between two earth on ground surfaces having a defined characteristic impedance). The switching matrices are housed in pairs onto the printed circuit boards, so that the number of stripline arrangements is reduced to 8 and the number of layers to 17. As a result of the relatively high characteristic impedance chosen (the advantage of a lower average power dissipation and an adaptation which is poorer in reflection) the multi-layer printed circuit boards described above are 13 mm high, 15 mm wide and 400 mm long.

With an increasing number of links between the switching matrices of adjacent switching stages the manufacturing engineering problems associated with the manufacture of multi-layer printed circuit boards are increased. This is due to the fact that for the connection of the individual layers the multi-layer printed circuit boards have to be drilled with extreme accuracy and also because the additional deposition of conductor (for example copper) after the drilling of the holes entails further problems. The degree of integration of the switching matrices has been limited from a production engineering point of view due to the problem of connecting the links to the switching matrices.

SUMMARY OF THE INVENTION

The invention has for its object to provide a broadband space-division switching network with linkage in a printed circuit board having multi-layer microstrip lines which can be manufactured in a simple manner and which requires little space.

This object is achieved in accordance with the invention by a broadband space-division switching network.

The wiring in accordance with the invention of a broadband space-division switching network is simple to manufacture from the manufacturing engineering standpoint and requires only slightly more space (compared to a printed circuit board having 2n+1 layers) as a result of the fanning out of the link sections combined into groups of the switching matrix on a layer of the printed circuit board.

When in accordance with the embodiment of the broadband space-division switching network in which a printed circuit board is used having two printed line surfaces, a non-intersecting structure can be manufactured in a simple way also for a high number of links, with only a slight increase in the line lengths of the links.

The embodiment of the broadband space-division switching network in which the links are non-intersecting is advantageous in that equal line lengths of the links are achieved in a simple way.

The embodiment of the broadband space-division switching network (in which the printed circuit board is composed of at least two portions, has the additional advantage that in case of a breakdown only the defective portion of the p.c. board has to be replaced, as a result of which the cost of spares can be reduced considerably. It has a further advantage, that by appropriately grouping the portions of the boards together a reduction of the outside measurements in one plane can be realized, if required. In addition, the p.c. board has the advantage that there is little waste during production.

If plug-in connectors are provided for connecting the portions of the p.c. boards, the time for exchanging defective portions of the p.c. boards can be reduced.

BRIEF DESCRIPTION OF THE DRAWING

The invention will be further described and explained with reference to the embodiments shown in the drawing in which.

DETAILED DESCRIPTION OF THE INVENTION

Figure 1:
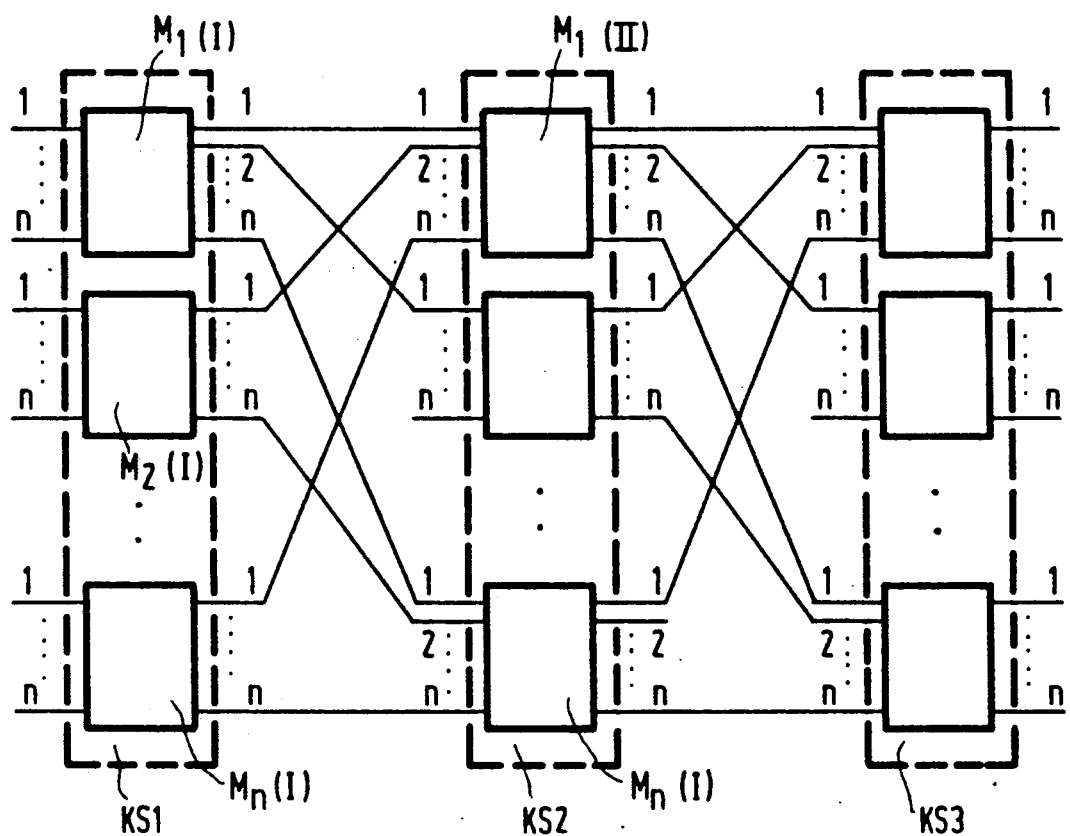
FIG. 1 shows a schematic diagram of a canonical linkage.

The canonical linkage shown in FIG. 1 has already been explained hereinbefore. The $n^{th}$ output of the switching matrix $M_n(I)$ of the first switching stage KS1 is connected to the $n^{th}$ input of the switching matrix $M_n(II)$ of the second switching stage KS2, etc . . .

Figure 2:
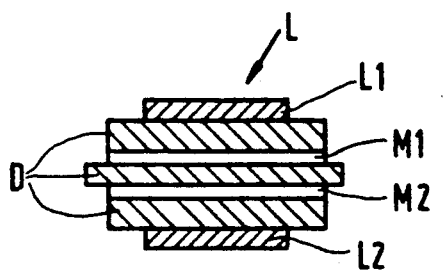
FIG. 2 shows a printed circuit board having two-layer printed lines.

In FIG. 2 is shown a sectional view of a printed circuit board L with two-layer printed lines realized in the micro-strip technology, i.e. with microstrips or striplines. Between the top printed line layer L1 and the bottom printed line layer L2 films of the dielectric D and respective ground films M1 and M2 are arranged alternately. Micro-strip technology implies in this context that, for example, printed line L1, dielectric film D and ground film M1, for example, belong together. The micro-strips (L1, D, M1 and L2, D, M2, respectively) formed thus are manufactured by sticking them together with the aid of an intermediate film (dielectric D). As a consequence of the shielding function of the respective earth films M1 and M2 the effect of mutual interference in the intermediate lines of the printed line layers L1 and L2 is avoided.

Figure 3:
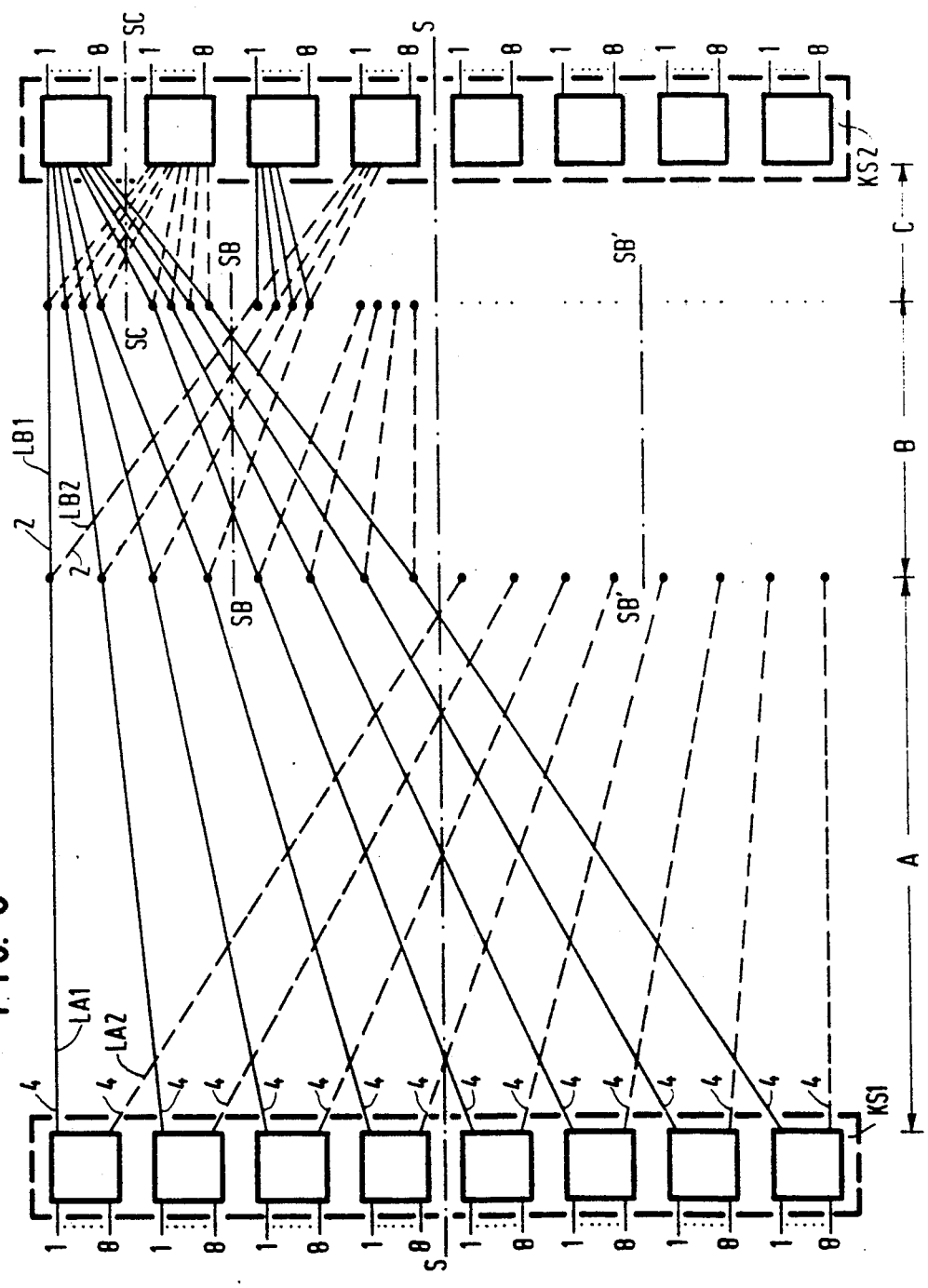
FIG. 3 shows a first embodiment of the canonical linkage utilizing a printed circuit board with two-layer printed lines.

FIG. 3 schematically shows a first embodiment of the canonical linkage utilizing the printed circuit board L having two printed line layers L1 and L2. Sectional portions of the respective line groups LA1 and LA2 will be obtained as a function of the number of output lines for each switching matrix, the line group LA1 being assigned to the top printed line layer L1 (solid line) and the line group LA2 being assigned to the bottom line layer L2 (broken line). The embodiment shown in FIG. 3 has 64 inputs and outputs of the respective individual switching stages KS1 and KS2 while the individual switching matrices themselves have eight inputs and outputs. Each switching matrix has eight outputs, four lines, having reference numeral 4, of line group LA1 on top of the circuit board are connected to four of the outputs, and four lines of line group LA2 on the bottom surface of the printed circuit board, having reference numeral 4, are connected to the other four of the outputs.

In section A there is a sub-division of each switching matrix into two groups according to the number of printed line layers and the combination of the groups, which are assigned to the top or bottom printed line layer, L1 or L2, respectively. In section B the fanning out into the two printed line layers L1 and L2 is repeated as well as the combination of the respective line groups LB1 and LB2 etc . . . In section C the separate line groups are finally fanned out into individual links so that the canonical linkage is accomplished. In particular, line group LA1 in section A fans out into LB1 and LB2 on the top and bottom surfaces of the circuit board, respectively. Each of the line groups LB1 and LB2 having the reference numeral 2 are comprised of two lines. Similarly, each of the line groups LB1 and LB2 fan out into a pair of single lines in section C, one line on the top surface and one on the bottom surface of the circuit board.

FIG. 3 shows that between the first switching matrix of the first switching stage KS1 and the second to the $n^{th}$ switching matrix of the second switching stage KS2 there is a lengthening of the links compared to the known linkage. This lengthening is an improvement over the prior art in that the individual links have only slightly different lengths, so that only slight differences in signal paths occur in the broadband space-division network.

The number of sections required depends on the number of output lines of a switching matrix. For $2^n$ outputs per switching matrix, n line sections are required when two printed line layers L1, L2 are available. The respective top and bottom printed line layers L1 and L2 are represented in FIGS. 3 and 4 by a solid line and a broken line, respectively, for the individual links.

Figure 4:
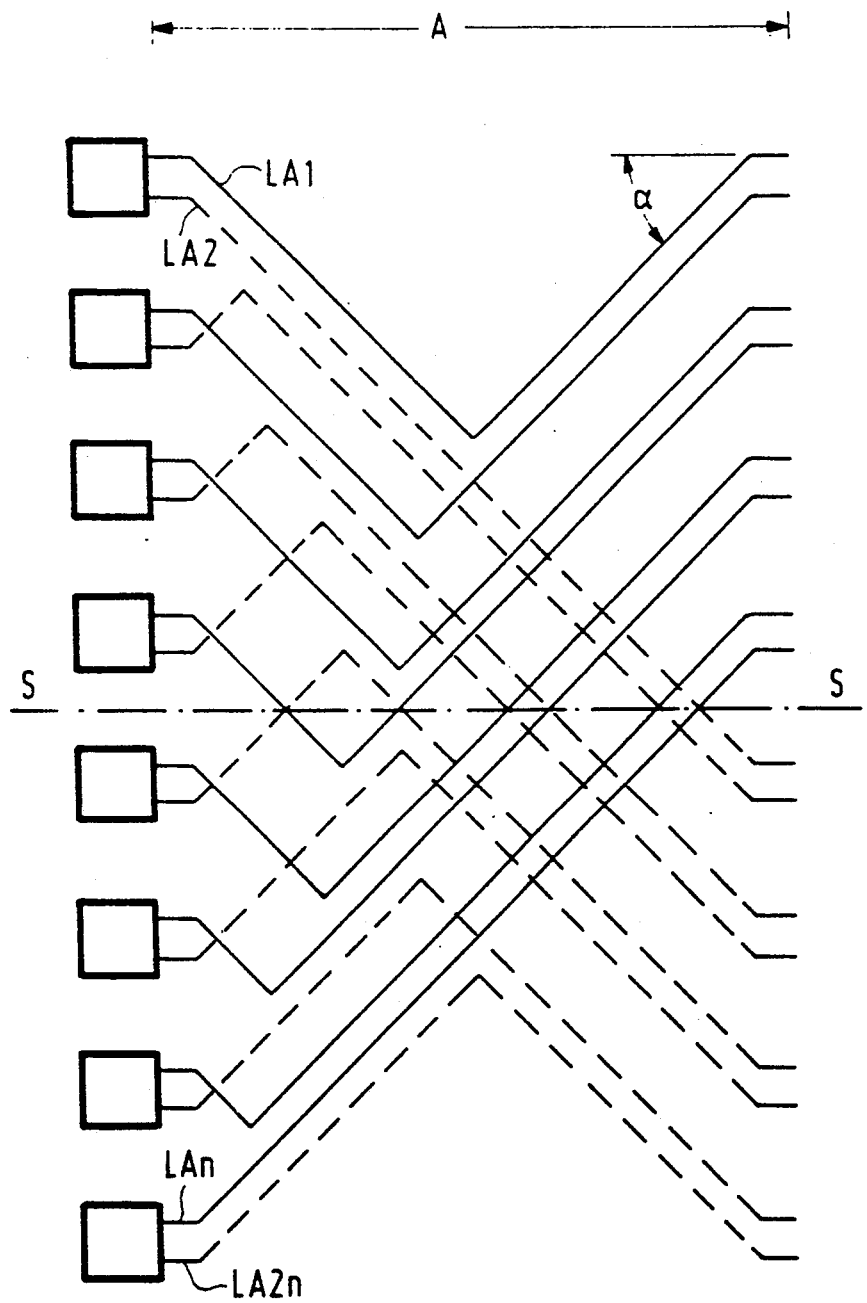
FIG. 4 shows a second embodiment of the canonical linkage with equal line lengths of the link sections and FIG. 5 shows a sectional view of a broadband space-division switching network in accordance with the invention.

FIG. 4 shows an embodiment of a canonical linkage with equal line lengths of the links per section. Starting from the line group LAn having the largest length and a rectilinear shape, all remaining line groups LAn-1, . . . , LA1 of the printed line layer L1 are arranged in a non-intersecting pattern and parallel to each other, so that they have the same line length as the line group LAn.

This bending pattern is repeated in a mirror-inverted way relative to the plane of symmetry S—S for the second printed line layer L2 with the line groups LA2, . . . LA2n. The bending patterns relative to the line of symmetry S—S are also repeated in the following sections B and C (see FIG. 3), while in section B the line groups in the two printed line layers above and below the line of symmetry S—S are congruent. In addition, in section B the bending patterns for each printed line layer are mirror inversions with respect to the lines of symmetry SB—SB and SB'—SB'. For section C there is a fourfold repetition of the bending pattern in vertical direction and a mirror inversion of the individual layers on the line of symmetry SC—SC.

Thus, to achieve equal line lengths the links in each section are non-intersecting and bent except for one link. In embodiments in which the longest link section (section A is) shorter, the links in the subsequent sections B and C become shorter accordingly. If the rectilinearly running link in each printed line layer encloses the angle $\alpha$ with respect to the horizontal and if this angle $\alpha$ is maintained in the subsequent sections B and C, the corresponding link lengths will be haived.

Depending on the number of output lines of a switching matrix, a plurality of link sections A, B, C, D etc. form a line. The surface required for accomodating the wiring is relatively large when there is a limitation to two printed line layers. When increasing the angle α, a shortening of the section can be obtained in a surprisingly simple manner. In this context it should be observed that adjacent printed lines are not spaced closer than a minimum distance (generally approximately the width of the printed line) in view of crosstalk. For realizing such wirings in the form of printed circuit boards these repetitions of the wiring samples as well as their mirror inversions in the individual layers imply an essential reduction of the cost for making the layout.

Figure 5:
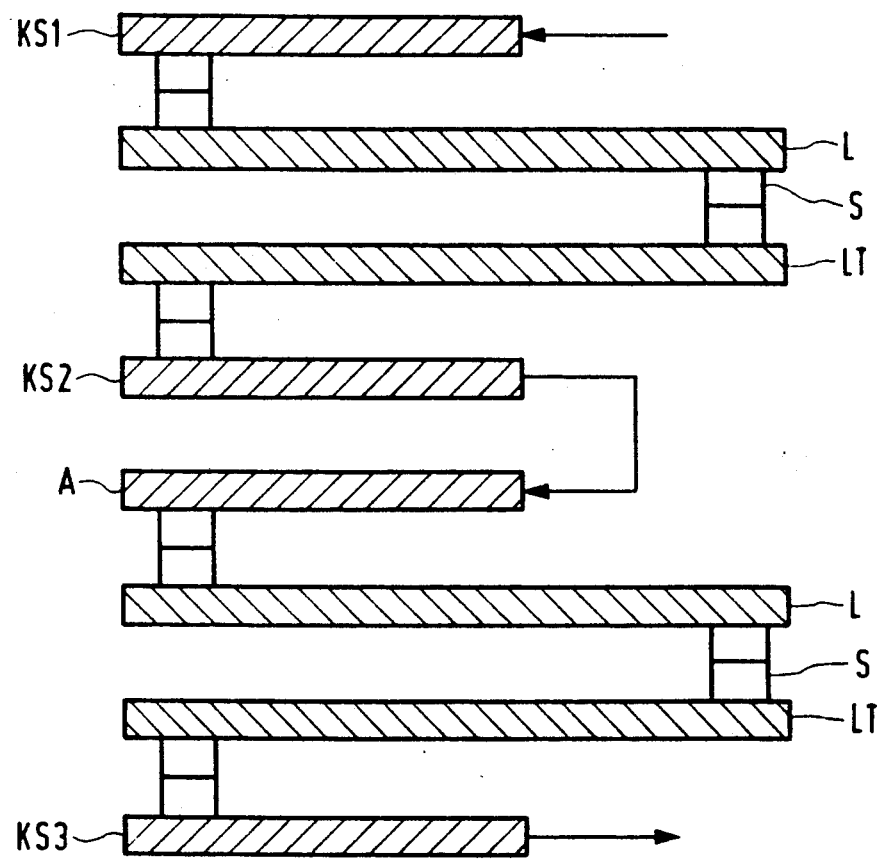

FIG. 5 shows a sectional view of the broadband space-division switching network in accordance with the invention. The shortening of the link sections in the horizontal direction allows plug-in connectors S at the end of section A and hence a reduction of the length of the printed circuit board L in one direction. The space required for the total structure of a multi-stage broadband space-division switching network is reduced, in that the portions LT of the p.c. board can be utilized as a carrier for the individual switching stages KS.

In case the composition of the broadband space-division switching network has to be effected with the aid of p.c. boards of equal structure, an adaptor A can be arranged at the output of the second switching stage KS2, connecting the outputs of this stage to the inputs of the next p.c. boards L and LT, respectively.

The broadband space-division switching network in accordance with the invention is simple to manufacture from the standpoint of manufacturing engineering, it requires little space for the total structure and can also be utilized for the construction of large space-division multiplex switching networks. The degree of integration of the switching matrices is in a surprisingly simple manner no longer limited by the required wiring to the switching matrices of adjacent switching stages. Setting up a broadband glass fiber network for novel types of communication (broadband ISDN), more specifically, an integrated broadband telephone network IBTN having a high number of subscriber connections is made possible by the broadband space-division switching network according to the invention.

What is claimed is:

1. A broadband space-division switching network comprising:
   a board for arrangement of printed circuitry thereon,
   a first plurality of switching matrices disposed on a first side of said board, forming a first switching stage,
   a second plurality of switching matrices disposed on said first side of said board, forming a second switching stage, and
   a plurality of groups of connection links, connection links of each group being connected to a respective switching matrix of said first stage, and each connection link connecting a respective one of the switching matrices of the first switching stage to a respective one of the switching matrices of the second stage,
   characterized in that the connections links are arranged in a pattern of lines,
   first and third groups of connection links comprise respective first and third groups of line portions extending respectively from a first and a third switching matrix of said first stage in respective directions along said first side of said board, and second and fourth groups of connection links comprise respective second and fourth groups of line portions extending respectively from a second and a fourth switching matrix of said first stage in respective directions along said second side of said board,
   at least some of said line portions of said third group extend in respective directions which are inclined with respect to a direction of at least some of said line portions of said first group,
   at least some of said line portions of said fourth group extend in respective directions which are inclined with respect to a direction of at least some of said line portions of said second group,
   line portions on one side of the board are free from crossings over each other, and line portions on a side opposite said one side of the board are free from crossings over each other,
   at least some of said line portions of said second group extend to respective positions opposite respective ones of said line portions of said first group and are electrically connected thereto at the respective positions, and
   at least some of said line portions of said fourth group extend to respective positions opposite respective ones of said line portions of said first group and respective positions opposite respective ones of said line portions of said third group; and each of said at least some of said line portions of said fourth group is electrically connected to the respective one of said line portions of said first group and to the respective one of said line portions of said third group at the respective positions.

2. A network as claimed in claim 1, characterized in that said pattern is a canonical pattern, and
   each of total lengths of line portions extending between and forming respective connection links between said first and second stage matrices are substantially equal.

3. A network as claimed in claim 2, characterized in that each of said lines is a multi-layer strip line.

4. A broadband space-division switching network comprising:
   a board for arrangement of printed circuitry thereon,
   a plurality of switching matrices disposed on a first side of said board, forming a first switching stage,
   an equal plurality of switching matrices disposed on said first side of said board, forming a second switching stage, and
   an equal plurality of groups of connection links, each group extending from a respective switching matrix of said first stage, and comprising an equal plurality of connection links each connecting to a respective one of the switching matrices of the second switching stage,
   characterized in that the connection links are arranged in a canonical pattern of multi-layer strip lines,
   first and third groups of connection links comprise respective first and third groups of strip line portions extending respectively from a first and a third switching matrix of said first stage in respective directions along said first side of said board, and second and fourth groups of connection links comprise respective second and fourth groups of strip line portions extending respectively from a second and a fourth switching matrix of said first stage in respective directions along said second side of said board, at least some of said strip line portions of said third group extend in respective directions which are inclined with respect to a direction of at least some of said strip line portions of said first group, at least some of said strip line portions of said fourth group extend in respective directions which are inclined with respect to a direction of at least some of said strip line portions of said second group, strip line portions on one side of the board are free from crossings over each other, and strip line portions on a side opposite said one side of the board are free from crossings over each other, at least some of said strip line portions of said second group extend to respective positions opposite respective ones of said strip line portions of said first group and are electrically connected thereto at the respective positions, and at least some of said strip line portions of said fourth group extend to respective positions opposite respective ones of said strip line portions of said first group and respective positions opposite respective ones of said strip line portions of said third group; and each of said at least some of said strip line portions of said fourth group is electrically connected to the respective one of said strip line portions of said first group and to the respective one of said strip line portions of said third group at the respective positions.

5. A broadband space-division switching network comprising:

a board for arrangement of printed circuitry thereon, a plurality of switching matrices disposed on a first side of said board, forming a first switching stage, an equal plurality of switching matrices disposed on said first side of said board, forming a second switching stage, and an equal plurality of groups of connection links, each group extending from a respective switching matrix of said first stage, and comprising an equal plurality of connection links each connecting to a respective one of the switching matrices of the second switching stage, characterized in that the connection links are arranged in a canonical pattern of lines, first and third groups of connection links comprise respective first and third groups of line portions extending respectively from a first and a third switching matrix of said first stage in respective directions along said first side of said board, and second and fourth groups of connection links comprise respective second and fourth groups of line portions extending respectively from a second and a fourth switching matrix of said first stage in respective directions along said second side of said board, at least some of said line portions of said third group extend in respective directions which are inclined with respect to a direction of at least some of said line portions of said first group, at least some of said line portions of said fourth group extend in respective directions which are inclined with respect to a direction of at least some of said line portions of said second group, line portions on one side of the board are free from crossings over each other, and line portions on a side opposite said one side of the board are free from crossings over each other, at least some of said line portions of said second group extend to respective positions opposite respective ones of said line portions of said first group and are electrically connected thereto at the respective positions, and at least some of said line portions of said fourth group extend to respective positions opposite respective ones of said line portions of said first group and respective positions opposite respective ones of said line portions of said third group; and each of said at least some of said line portions of said fourth group is electrically connected to the respective one of said line portions of said first group and to the respective one of said line portions of said third group at the respective positions.

6. A network as claimed in claim 5, characterized in that each of the total lengths of line portions extending between and forming respective connection links between said first and second stage matrices are substantially equal.

7. A network as claimed in claim 6, characterized in that each of said line portions is a straight multi-layer strip line portion.

8. A network as claimed in claim 7, characterized in that at least some of the strip line portions of each group extend in directions which are inclined to at least some of the strip line portions of every other group.

9. A network as claimed in claim 8, characterized in that the strip line portions of each group fan out in a plurality of directions inclined with respect to each other.

10. A network as claimed in claim 5, characterized in that at least some of the line portions of each group extend in directions which are inclined to at least some of the line portions of every other group.

11. A network as claimed in claim 6, characterized in that each line portion is a straight line portion.

12. A network as claimed in claim 11, characterized in that the line portions of each group fan out in a plurality of directions inclined with respect to each other.

13. A network as claimed in claim 5, characterized in that the line portions of each group fan out in a plurality of directions inclined with respect to each other.

* * * * *